US012492486B2

(12) United States Patent
Jeon et al.

(10) Patent No.: US 12,492,486 B2
(45) Date of Patent: Dec. 9, 2025

(54) INGOT GROWING APPARATUS COMPRISING HEATER AND METHOD FOR MANUFACTURING HEATER FOR INGOT GROWING APPARATUS

(71) Applicants: HANWHA SOLUTIONS CORPORATION, Seoul (KR); HANWHA CORPORATION, Seoul (KR)

(72) Inventors: Han Woong Jeon, Seoul (KR); Kyung Seok Lee, Seoul (KR); Young Jun Lee, Seoul (KR)

(73) Assignees: HANWHA SOLUTIONS CORPORATION, Seoul (KR); Hanwha Corporation, Seoul (KR)

( * ) Notice: Subject to any disclaimer, the term of this patent is extended or adjusted under 35 U.S.C. 154(b) by 240 days.

(21) Appl. No.: 18/246,700

(22) PCT Filed: Sep. 3, 2021

(86) PCT No.: PCT/KR2021/011945
§ 371 (c)(1),
(2) Date: Mar. 27, 2023

(87) PCT Pub. No.: WO2022/065739
PCT Pub. Date: Mar. 31, 2022

(65) Prior Publication Data

US 2023/0383433 A1 Nov. 30, 2023

(30) Foreign Application Priority Data

Sep. 28, 2020 (KR) ........................ 10-2020-0126315

(51) Int. Cl.
*C30B 15/14* (2006.01)
*C30B 15/10* (2006.01)
*C30B 29/06* (2006.01)

(52) U.S. Cl.
CPC .............. *C30B 15/14* (2013.01); *C30B 15/10* (2013.01); *C30B 29/06* (2013.01)

(58) Field of Classification Search
CPC .......... C30B 15/10; C30B 15/14; C30B 29/06
See application file for complete search history.

(56) References Cited

U.S. PATENT DOCUMENTS 5,134,261 A * 7/1992 Larkin ..................... H05B 6/24 219/649
5,198,017 A * 3/1993 Mourer ..................... B22F 9/08 222/592

(Continued)

FOREIGN PATENT DOCUMENTS

JP 4749661 B2 8/2011
JP 4808922 B2 11/2011

(Continued)

*Primary Examiner* — Hua Qi
(74) *Attorney, Agent, or Firm* — Harvest IP Law, LLP

(57) ABSTRACT

An ingot growing apparatus is disclosed. An ingot growing apparatus comprising a heater according to an aspect of the present invention may comprise: a crucible for accommodating molten silicon; a growth furnace having an inner space in which the crucible is installed; a susceptor having an inner surface shaped to correspond to an outer surface of the crucible and surrounding the outer surface of the crucible; and a heater for heating the susceptor, wherein the heater may comprise: a coil which is fixed at a position spaced a predetermined distance apart from an outer surface of the susceptor, is formed to be wound along the outer surface of the susceptor to generate a magnetic field, and heats the susceptor by electromagnetic induction due to the magnetic field; and a shield which is formed to surround an outer surface of the coil to support the coil and blocks the coil from being exposed to the inner space of the growth furnace.

9 Claims, 9 Drawing Sheets

(56) References Cited

U.S. PATENT DOCUMENTS

| | | | | |
|---|---|---|---|---|
| 2005/0064761 | A1* | 3/2005 | Stanford .............. | H01R 13/005<br>439/577 |
| 2010/0089312 | A1* | 4/2010 | Wiseman .............. | C30B 11/003<br>219/635 |

FOREIGN PATENT DOCUMENTS

| | | | | |
|---|---|---|---|---|
| JP | 5228671 | B2 | | 7/2013 |
| KR | 20100053283 | A | * | 5/2010 |
| KR | 20180106352 | A | * | 10/2018 |
| KR | 20200070760 | A | | 6/2020 |
| KR | 102138121 | B1 | | 7/2020 |
| KR | 102271712 | B1 | | 7/2021 |

* cited by examiner

INGOT GROWING APPARATUS COMPRISING HEATER AND METHOD FOR MANUFACTURING HEATER FOR INGOT GROWING APPARATUS

CROSS-REFERENCE TO RELATED APPLICATION(S)

This application is a National Stage of International Application No. PCT/KR2021/011945 filed on Sep. 3, 2021, claiming priority based on Korean Patent Application No. 10-2020-0126315 filed on Sep. 28, 2020, the disclosure of which is incorporated herein by reference in its entirety.

TECHNICAL FIELD

The present invention relates to an ingot manufacturing apparatus including a heater and a method for manufacturing a heater for an ingot growing apparatus, and more specifically, to an ingot growing apparatus including a heater for improving energy efficiency of ingot manufacturing, and a method for manufacturing the heater for the ingot growing apparatus.

BACKGROUND

In general, a Czochralski crystal growth method is mainly used as an ingot manufacturing method for manufacturing single crystal silicon wafers for semiconductors.

In the Czochralski crystal growth method, silicon is put into a crucible and the crucible is heated to melt the silicon. Then, when a single crystal seed is pulled upward simultaneously with rotation in a state in contact with the molten silicon, an ingot having a predetermined diameter is grown.

In a conventional ingot manufacturing apparatus, a heater radiating radiant heat in a resistance heating method is provided around the crucible. Such a heater heats the crucible to produce molten silicon.

However, the heater of the conventional resistance heating method heats not only the crucible, but also the entire inside of the ingot growing apparatus, causing a problem of large power energy consumption.

SUMMARY

Technical Problem

According to an aspect of the present invention, it is directed to providing an ingot growing apparatus comprising a heater that can improve the efficiency of energy consumed to produce molten silicon, and a method for manufacturing the heater for the ingot growing apparatus.

Technical Solution

An ingot growing apparatus comprising a heater according to an aspect of the present invention may comprise: a crucible for accommodating molten silicon; a growth furnace having an inner space in which the crucible is installed; a susceptor having an inner surface shaped to correspond to an outer surface of the crucible and surrounding the outer surface of the crucible; and a heater for heating the susceptor, wherein the heater may comprise: a coil which is fixed at a position spaced a predetermined distance apart from an outer surface of the susceptor, is formed to be wound along the outer surface of the susceptor to generate a magnetic field, and heats the susceptor by electromagnetic induction due to the magnetic field; and a shield which is formed to surround an outer surface of the coil to support the coil and blocks the coil from being exposed to the inner space of the growth furnace.

In this case, the coil may be formed to be wound multiple times along the outer surface of the susceptor, and a plurality of nuts may be formed on the outer surface of the coil.

In this case, the plurality of nuts may be made of the same material as the coil.

In this case, the susceptor includes a shield body having a shape corresponding to the outer surface of the susceptor; and a nut blocking part disposed inside the shield body to block the plurality of nuts from being exposed to the outside.

In this case, the nut blocking part may be formed in a shape corresponding to a bolt shape.

In this case, the shield may be made of a non-metallic material.

In this case, the shield may include a ceramic material.

In this case, the ceramic may include at least one of aluminum oxide ($Al_2O_3$), silicon dioxide ($SiO_2$), and zirconium dioxide ($ZrO_2$).

In this case, the shield may be disposed spaced apart from the susceptor.

A method for manufacturing a heater for an ingot growing apparatus according to an aspect of the present invention may include forming a coil by winding a coil around a coil support member having a shape corresponding to an outer surface of a susceptor; coupling a plurality of nuts to an outer surface of the coil; preparing a mold having an inner space accommodating the coil; accommodating the coil in the mold; coupling the mold and the plurality of nuts with a plurality of pins; first injecting a refractory into the mold; manufacturing a shield surrounding the coil by solidifying the refractory; removing the plurality of pins; and second injecting a refractory into a screw hole created by removing the pin.

In this case, the refractory may be made by mixing 92% to 94% by weight of ceramic powder and 6% to 8% by weight of water.

In this case, the ceramic powder may include at least one of aluminum oxide ($Al_2O_3$), silicon dioxide ($SiO_2$), and zirconium dioxide ($ZrO_2$).

In this case, the step of first injecting a refractory may include a step of applying vibration to the mold by a vibration device.

In this case, the step of manufacturing a shield may include a step of first drying a refractory at room temperature for 24 hours to 48 hours.

In this case, the step of manufacturing a shield may include a step of second drying a refractory at 100° C. to 350° C. for 48 hours to 72 hours.

Advantageous Effects

According to the above configuration, the ingot growing apparatus comprising the heater according to an aspect of the present invention heats only the crucible by electromagnetic induction of the coil, so that energy efficiency for heating the crucible can be improved.

In addition, in the ingot growing apparatus comprising the heater according to an aspect of the present invention, since the shield blocks the coil from being exposed to the outside, it prevents the arc from being generated by the coil in a vacuum atmosphere, thereby ensuring the stability of the ingot growing apparatus.

In addition, in the ingot growing apparatus comprising the heater according to an aspect of the present invention, since the shield supports the coil, there is no need for a separate support member for supporting the coil, preventing the purity of the ingot from deteriorating due to the separate support member.

Figure 1:
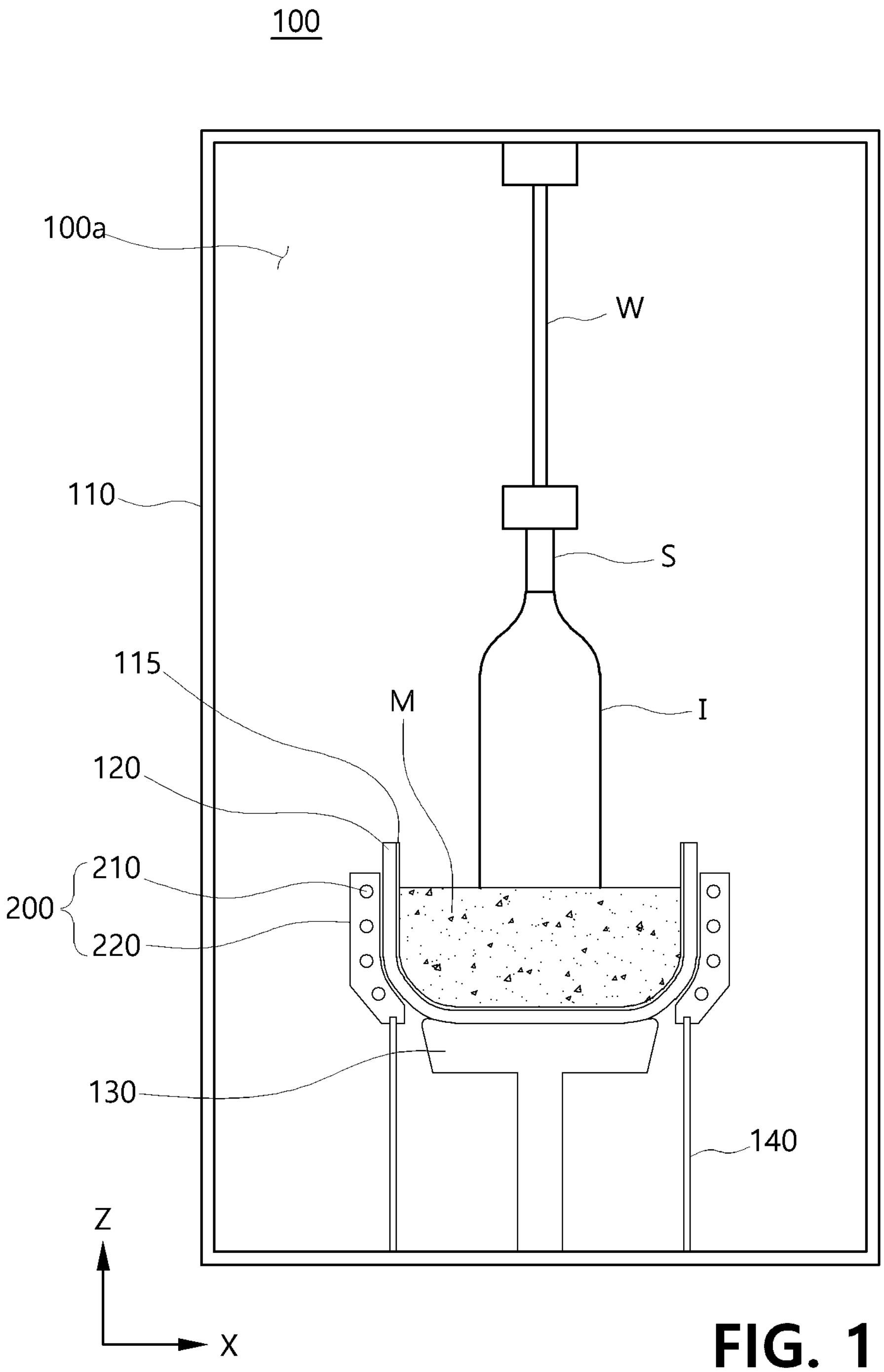
FIG. 1 is a view schematically showing an ingot growing apparatus comprising a heater according to an embodiment of the present invention.

| Description of Symbols | |
|---|---|
| 100: ingot growing apparatus | 110: growth furnace |
| 115: crucible | 120: susceptor |
| 130: crucible support | 200: heater |
| 210: coil | 220: shield |

DETAILED DESCRIPTION OF THE EMBODIMENTS

Terms and words used in the present specification and claims should not be construed as limited to their usual or dictionary definition, and they should be interpreted as a meaning and concept consistent with the technical idea of the present invention based on the principle that inventors may appropriately define the terms and concept in order to describe their own invention in the best way.

Accordingly, the embodiments described in the present specification and the configurations shown in the drawings correspond to preferred embodiments of the present invention, and do not represent all the technical idea of the present invention, so the configurations may have various examples of equivalent and modification that can replace them at the time of filing the present invention.

It should be understood that the terms "comprise" or "have" when used in this specification, are intended to describe the presence of stated features, integers, steps, operations, elements, components and/or a combination thereof but not preclude the possibility of the presence or addition of one or more other features, integers, steps, operations, elements, components, or a combination thereof.

The presence of an element in/on "front", "rear", "upper or above or top" or "lower or below or bottom" of another element includes not only being disposed in/on "front", "rear", "upper or above or top" or "lower or below or bottom" directly in contact with other elements, but also cases in which another element being disposed in the middle, unless otherwise specified. In addition, unless otherwise specified, that an element is "connected" to another element includes not only direct connection to each other but also indirect connection to each other.

Hereinafter, an ingot manufacturing apparatus according to an embodiment of the present invention will be described with reference to the drawings. In this specification, in describing the ingot growing apparatus according to an embodiment of the present invention, configurations not related to the contents of the present invention will not be shown in detail or will be omitted for simplicity of the drawing, and the ingot growing apparatus according to the present invention will be described with a focus on the contents related to the idea of the present invention.

In this specification, the X-axis shown in the drawing is perpendicular to the Y-axis and perpendicular to the Z-axis. And, the Y-axis shown in the drawing is perpendicular to the Z-axis. And, the arrow direction of the Z-axis is referred to as upward. Downward means a direction opposite to the upward.

FIG. 1 is a view schematically showing an ingot growing apparatus comprising a heater according to an embodiment of the present invention.

Referring to FIG. 1, an ingot manufacturing apparatus 100 according to an embodiment of the present invention may include a growth furnace 110, a crucible 115, a susceptor 120, a susceptor support part 130, and a heater 200.

The growth furnace 110 has an inner space **110*a* maintained in a vacuum state, and an ingot I is grown in the inner space 110*a*. The crucible 115 to be described later is installed in the inner space 110*a***.

A vacuum pump (not shown) and an inert gas supply unit (not shown) may be provided in the growth furnace 110. The vacuum pump may maintain the inner space **110*a* in a vacuum atmosphere. In addition, the inert gas supply unit may supply an inert gas to the inner space 110*a***. The inert gas may be, for example, argon (Ar).

The crucible 115 may be accommodated in the inner space **110*a* of the growth furnace 110. The crucible 115 may accommodate molten silicon (M). The crucible 115 may generally be formed in a reverse dome shape. In addition, the crucible 115** is not limited to being formed in a reverse dome shape, and may be formed in various shapes such as a cylinder shape.

And, the crucible 115 may be made of a silica material. However, the crucible 115 is not limited to being made of a silica material, and may include various materials that withstand rapid changes in temperature while having heat resistance at a temperature of about 1400° C. or higher. Further, in a state in which a single crystal seed S is in contact with the molten silicon M accommodated in the crucible 115, when a wire W connected to the upper side of the growth furnace 110 pulls the single crystal seed S upward, an ingot I having a predetermined diameter may be grown.

In addition, the growth furnace 110 may have a quantitative supply unit (not shown) for supplying a solid silicon raw material to the crucible 115. The quantitative supply unit (not shown) may receive the solid silicon raw material from a material supply unit (not shown) and supply it to the crucible 115. The crucible 115 melts the solid silicon raw material supplied from the quantitative supply unit and accommodates the molten silicon M.

The susceptor 120 may surround an outer surface of the crucible 115. The susceptor 120 may support the crucible 115. An inner surface of the susceptor 120 may have a shape corresponding to an outer surface of the crucible 115. For example, if the crucible 115 has a reverse dome shape, the susceptor 120 may also have a reverse dome shape. The susceptor 120 may include a graphite material. In addition, the susceptor 120 is not limited to being made of graphite material, and may include various materials having strong heat resistance and conductive properties.

Accordingly, even if the crucible 115 is made of a silica material and is deformed at a high temperature, the susceptor 120 may surround and support the crucible 115 so that the crucible 115 maintains a state of accommodating the molten silicon M. In addition, the crucible 115 made of silica blocks contact between the molten silicon M and the susceptor 120 made of the graphite material, preventing graphite from becoming an impurity of the molten silicon M.

In addition, the susceptor support part 130 supporting the susceptor 120 is disposed in the lower side of the growth furnace 110. The upper end of the susceptor support part 130 may have a shape corresponding to the lower end of the susceptor 120. In addition, in a state in which the susceptor support part 130 supports the susceptor 120 at the lower side of the growth furnace 110, the susceptor support part 130 may be rotated together with the susceptor 120. Accordingly, in a state in which the crucible 115 accommodates the molten silicon M, the crucible 115 may be rotated together with the susceptor 120.

In addition, the growth furnace 110 has a driving unit (not shown) that provides rotational force to rotate the susceptor support part 130. The susceptor support part 130 may be rotatably connected to the driving unit. When the driving unit receives power and provides rotational force to the susceptor support part 130, the crucible 115 is rotated together with the susceptor 120.

The heater 200 is provided in the inner space 110*a* of the growth furnace 110. The heater 200 includes a coil 210 and a shield 220.

The coil 210 may be fixed at a position spaced apart from the outer surface 121 of the susceptor 120 by a predetermined interval and wound along the outer surface of the crucible 115. For example, the coil 210 may be formed in various shapes, such as a spiral shape, a vortex shape, or a shape in which a part of the coil 210 is wound horizontally around the outer surface of the crucible 115 and the other part of the coil 210 is wound inclinedly around the outer surface of the crucible 115. The coil 210 may be made of a copper material. However, the coil 210 is not limited to being made of a copper material, and may include various materials having electrical conductivity.

The coil 210 may generate a magnetic field by receiving power. The coil 210 generates electric current in the susceptor 120 by electromagnetic induction due to a magnetic field. And, the electric current generated in the susceptor 120 is converted into thermal energy. Accordingly, the coil 210 may heat the susceptor 120 by an induction heating method. As the susceptor 120 is heated, the susceptor 120 may heat the crucible 115.

The shield 220 is formed to surround the outer surface of the coil 210. The shield 220 may support the coil 210 so that the coil 210 maintains a constant shape (e.g., a spiral shape, etc.). The shield 220 may block the coil 210 from being exposed to the outside. Here, the outside means the outside of the coil 210, that is, the inner space 110*a* of the growth furnace 110. Accordingly, the shield 220 blocks the coil 210 from being exposed to the inner space 110*a* of the growth furnace 110, and thus when the coil 210 is supplied with power to form a magnetic field, it may be possible to prevent arc discharge from occurring due to plasma phenomenon in the vacuum state, or arc discharge from occurring caused by contacting the coil 210 with inert gas (e.g., argon) present in the inner space 110*a* of the growth furnace 110.

The coil 210 and the shield 220 will be described in detail later with reference to drawings.

In addition, a shield support part 140 supporting the shield 220 is disposed in the lower side of the growth furnace 110. The shield support part 140 may be formed in a substantially cylindrical shape. The susceptor support part 130 may be disposed inside the shield support part 140 having a cylindrical shape. In addition, the upper end of the shield support part 140 has a shape corresponding to the lower end of the shield 220, so that the shield 220 may be disposed on the upper end of the shield support part 140.

Figure 2:
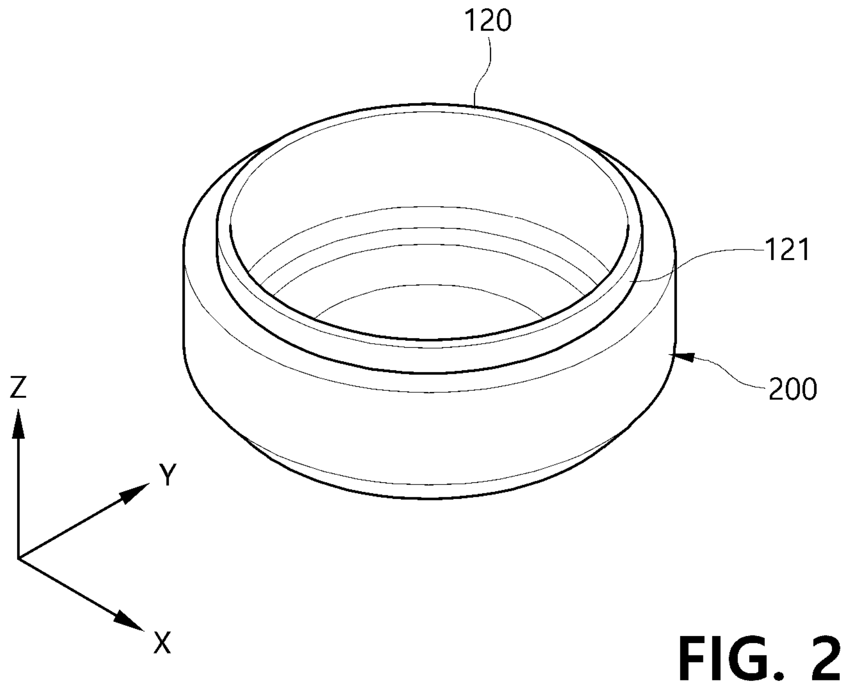
FIG. 2 is a perspective view showing a susceptor and a shield of an ingot growing apparatus comprising a heater according to an embodiment of the present invention.
Figure 3:
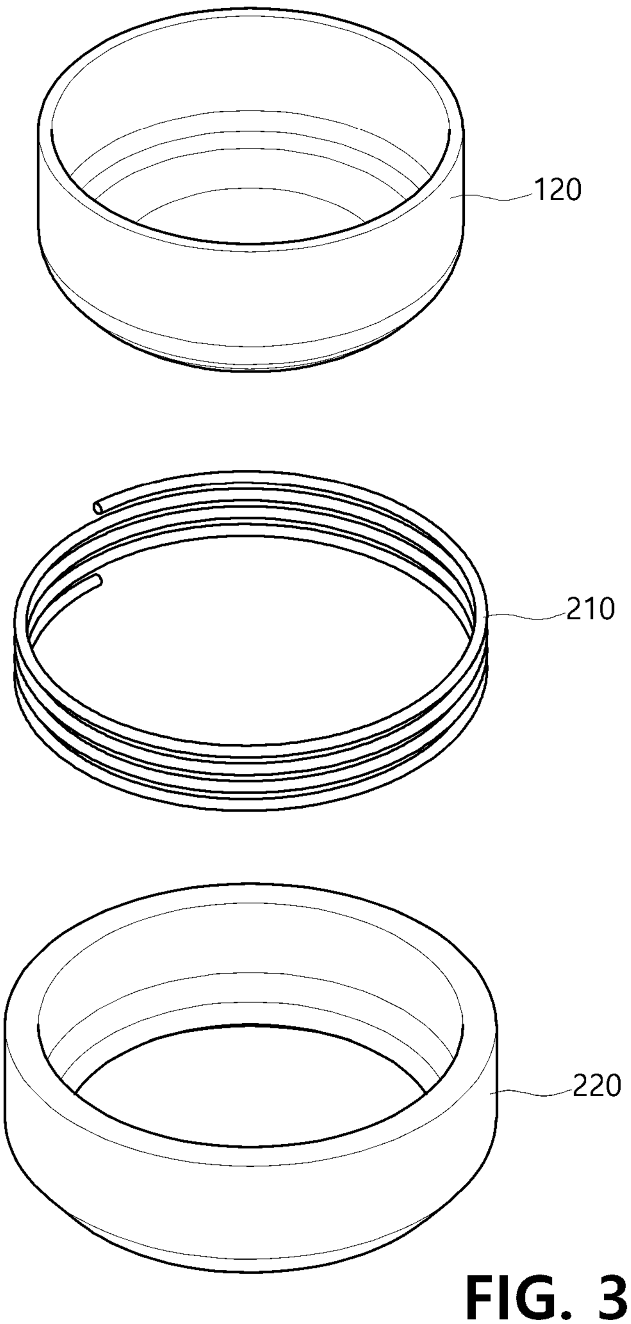
FIG. 3 is an exploded perspective view showing a susceptor and a heater of an ingot growing apparatus comprising a heater according to an embodiment of the present invention.
Figure 4:
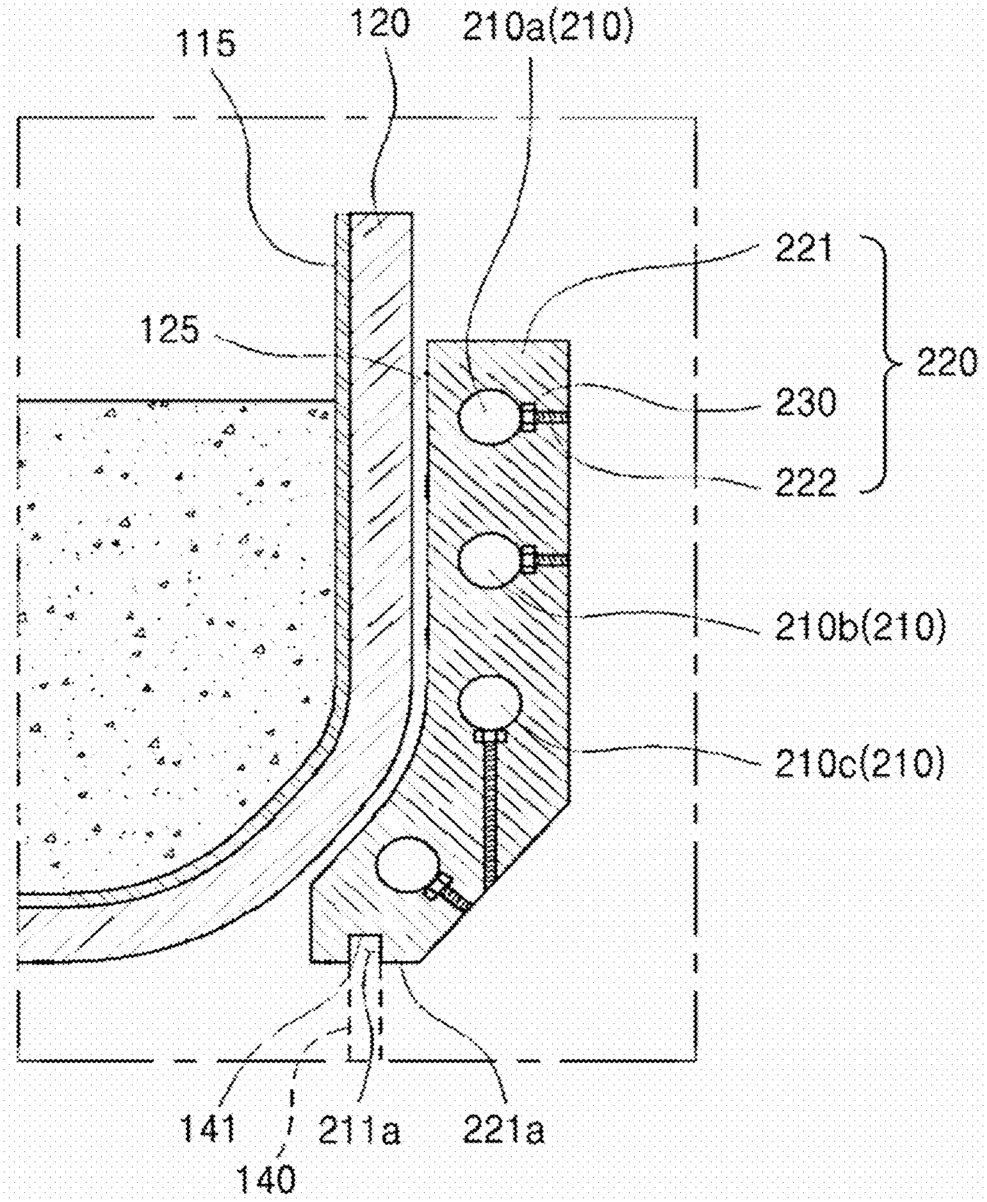
FIG. 4 is an enlarged view of portion A shown in FIG. 1.

FIG. 2 is a perspective view showing a susceptor and a shield of an ingot growing apparatus comprising a heater according to an embodiment of the present invention, FIG. 3 is an exploded perspective view showing a susceptor and a heater of an ingot growth apparatus comprising a heater according to an embodiment of the present invention, and FIG. 4 is an enlarged view of portion A shown in FIG. 1.

Referring to FIGS. 2 to 4, the coil 210 may be formed to be spirally wound multiple times along the outer surface 121 of the susceptor 120. The coil 210 may include a first coil 210*a* wound along the outer surface 121 of the susceptor 120, a second coil 210*b* wound along the outer surface 121 of the susceptor 120 while being spaced apart from the first coil 210*a*, and a third coil 210*c* wound along the outer surface 121 of the susceptor 120 while being spaced apart from the second coil 210*b*.

Referring to FIG. 4, when viewed in a vertical direction, the first coil 210*a* may be spaced apart from the second coil 210*b* by a first interval. The second coil 210*b* may be spaced apart from the third coil 210*c* by a second interval. In addition, the first interval and the second interval may be the same. In addition, according to various embodiments of the present invention, the first interval may be greater than the second interval. In addition, the coil 210 may include a plurality of coils such as a fourth coil, a fifth coil, a sixth coil, etc. according to the number of times the coil 210 is wound around the outer surface 121 of the susceptor 120. The magnetic field generated from the coil 210 may be controlled by the number of the plurality of coils according to the number of times the coil 210 is wound along the outer surface 121 of the susceptor 120 and the distance between the plurality of coils.

In addition, a plurality of nuts 230 may be formed on the outer surface of the coil 210. The plurality of nuts 230 may be fastened to the outer surface of the coil 210 by welding to face the outer surface of the shield 220. The plurality of nuts 230 may be connected to bolts (not shown) connected to a mold for manufacturing the shield 220.

In addition, the plurality of nuts 230 may be made of the same material as the coil 210. For example, when the coil 210 is made of copper material, the plurality of nuts 230 may be made of copper material. Since the material of the plurality of nuts 230 is the same as that of the coil 210, the coil 210 prevents an increase in electrical resistance caused by the plurality of nuts 230 when power is supplied.

In addition, the shield 220 may include a shield body 221 and a nut blocking part 222.

The shield body 221 may have a shape corresponding to the outer surface 121 of the susceptor 120. For example, the shield body 221 has a substantially reverse dome shape, and has an opening formed in a central region. The lower side of the susceptor 120 may pass through the opening and be supported by the aforementioned susceptor support part 130 (see FIG. 1).

In addition, the shield body 221 may be made of a non-metallic material. In addition, the shield body 221 may include a ceramic material. For example, the ceramic may include at least one of aluminum oxide ($Al_2O_3$), silicon dioxide ($Si_2O_2$), and zirconium dioxide ($ZrO_2$). As the shield body 221 is made of a ceramic material, damage to the shield body 221 is prevented even in a high temperature state.

In addition, the shield body 221 may be disposed spaced apart from the susceptor 120. A blocking space 125 is formed between the susceptor 120 and the shield body 221. When the susceptor 120 is heated by electromagnetic induction by the coil 210, the blocking space 125 prevents heat from the susceptor 120 from being transferred back to the shield body 221. That is, the blocking space 125 prevents heat from the susceptor 120 from being transferred to a place other than the crucible 115 to prevent energy loss, thereby improving energy efficiency of the ingot growing apparatus.

In addition, a fastening hole 211*a* may be formed in the lower end 221*a* of the shield body 221. The fastening hole 211*a* may have a shape corresponding to the upper end 141 of the shield support part 140. As the upper end 141 of the shield support part 140 is inserted into the fastening hole 211*a*, the shield 220 may be stably supported by the shield support part 140.

In addition, according to various embodiments of the present invention, a sensor (not shown) for measuring the temperature of the susceptor 120 may be provided in the growth furnace 110. In this case, the sensor for measuring the temperature may be an optical sensor. In addition, a through hole (not shown) for movement of light emitted from the sensor may be formed on a side surface of the shield body 221. The light emitted from the sensor may reach the susceptor 120 through the through hole and be reflected, and the sensor may receive the reflected light to measure the temperature of the susceptor 120.

The nut blocking part 222 may be disposed inside the shield body 221. The nut blocking part 222 may block the plurality of nuts 230 from being exposed to the outside. The nut blocking part 222 may be formed in a shape corresponding to a pin shape. When the bolts connected to the plurality of nuts 230 are removed during the manufacturing process of the shield 220, the nut blocking part 222 may seal the bolt-shaped holes formed in the shield body 221.

In addition, the nut blocking part 222 may be made of the same material as the shield body 221. In addition, the nut blocking part 222 may be made of a non-metallic material. In addition, the nut blocking part 222 may include a ceramic material. For example, the ceramic may include at least one of aluminum oxide ($Al_2O_3$), silicon dioxide ($SiO_2$), and zirconium dioxide ($ZrO_2$).

Hereinafter, a method for manufacturing a heater for an ingot growing apparatus according to another embodiment of the present invention will be described with reference to the drawings.

Figure 5:
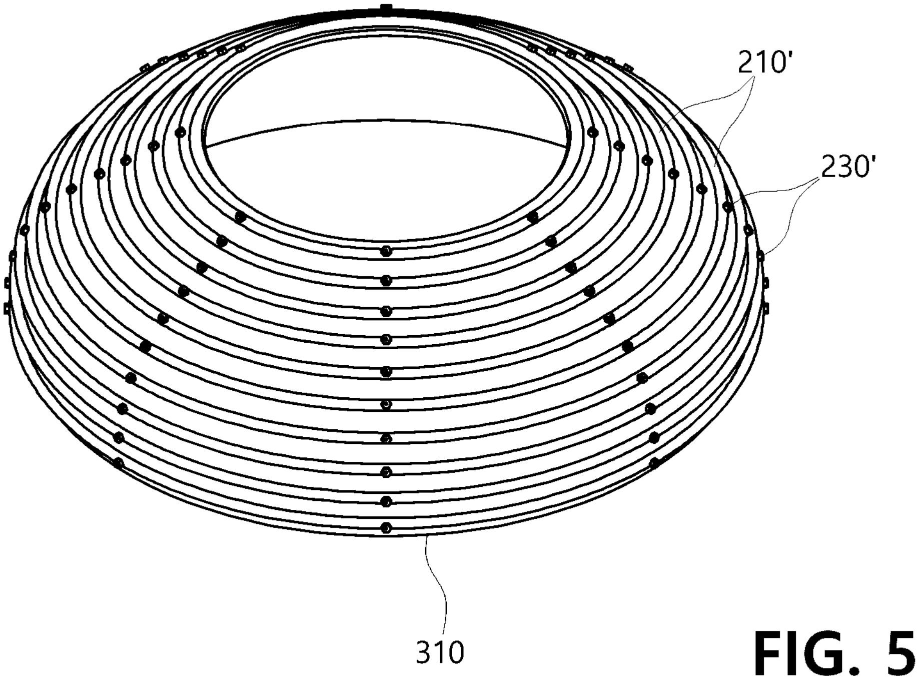
FIG. 5 is a perspective view showing forming a coil in a method for manufacturing a heater for an ingot growing apparatus according to another embodiment of the present invention.
Figure 6:
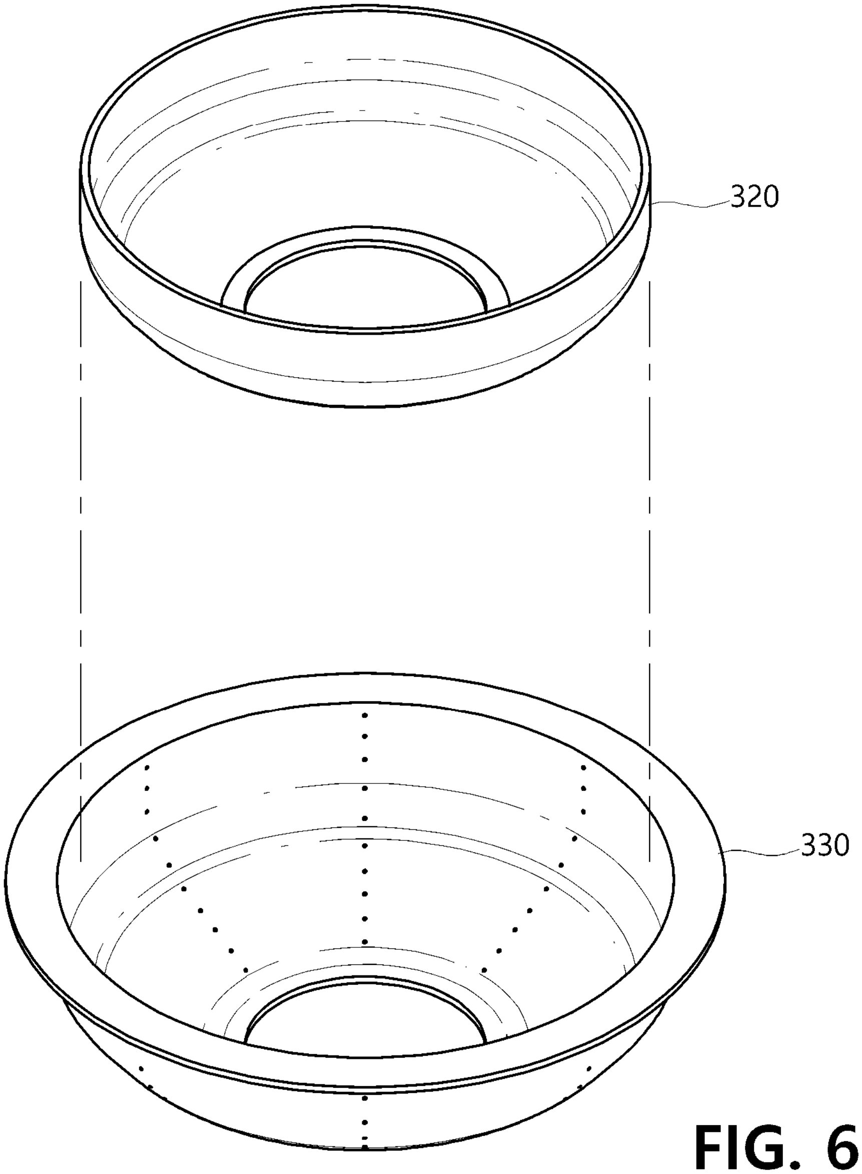
FIG. 6 is an exploded perspective view showing a mold in a method for manufacturing a heater for an ingot growing apparatus according to another embodiment of the present invention.
Figure 7:
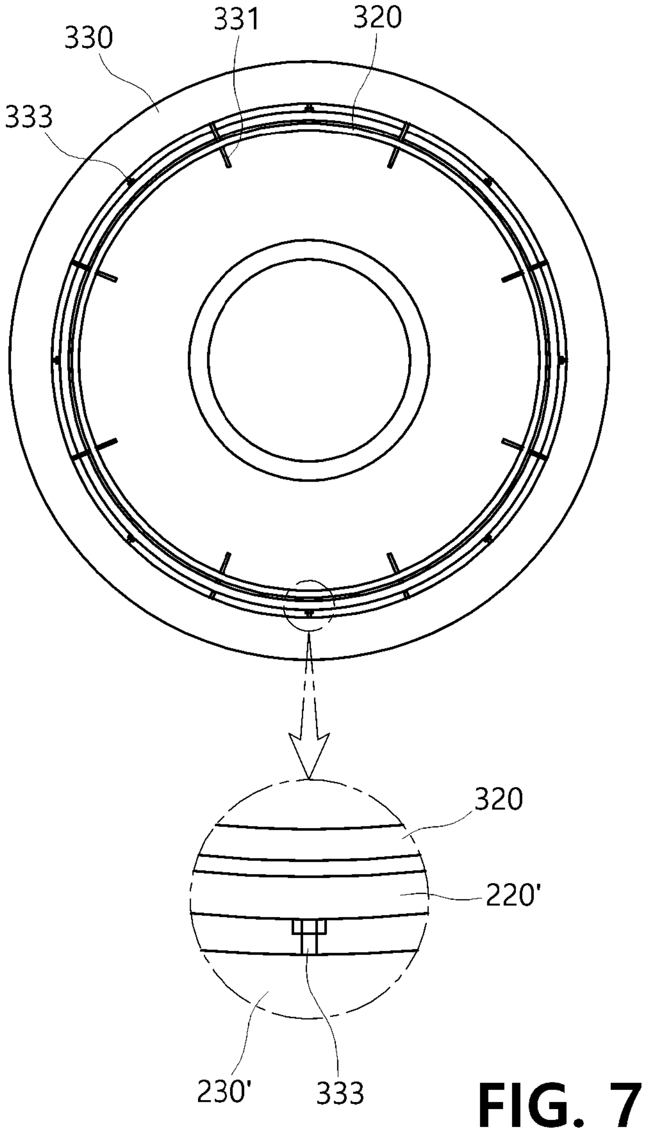
FIG. 7 is a view showing coupling a plurality of pins in a method for manufacturing a heater for an ingot growing apparatus according to another embodiment of the present invention.
Figure 8:
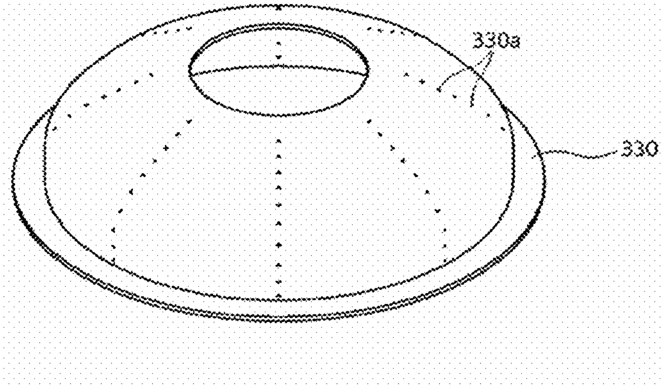
FIG. 8 is a view showing a state in which a plurality of pins are removed in a method for manufacturing a heater for an ingot growing apparatus according to another embodiment of the present invention.
Figure 9:
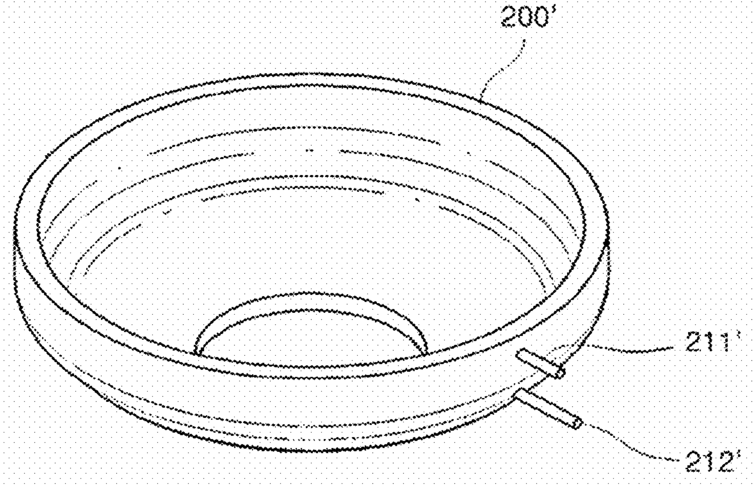
FIG. 9 is a perspective view showing a shield manufactured by a method for manufacturing a heater for an ingot growing apparatus according to another embodiment of the present invention.
Figure 10:
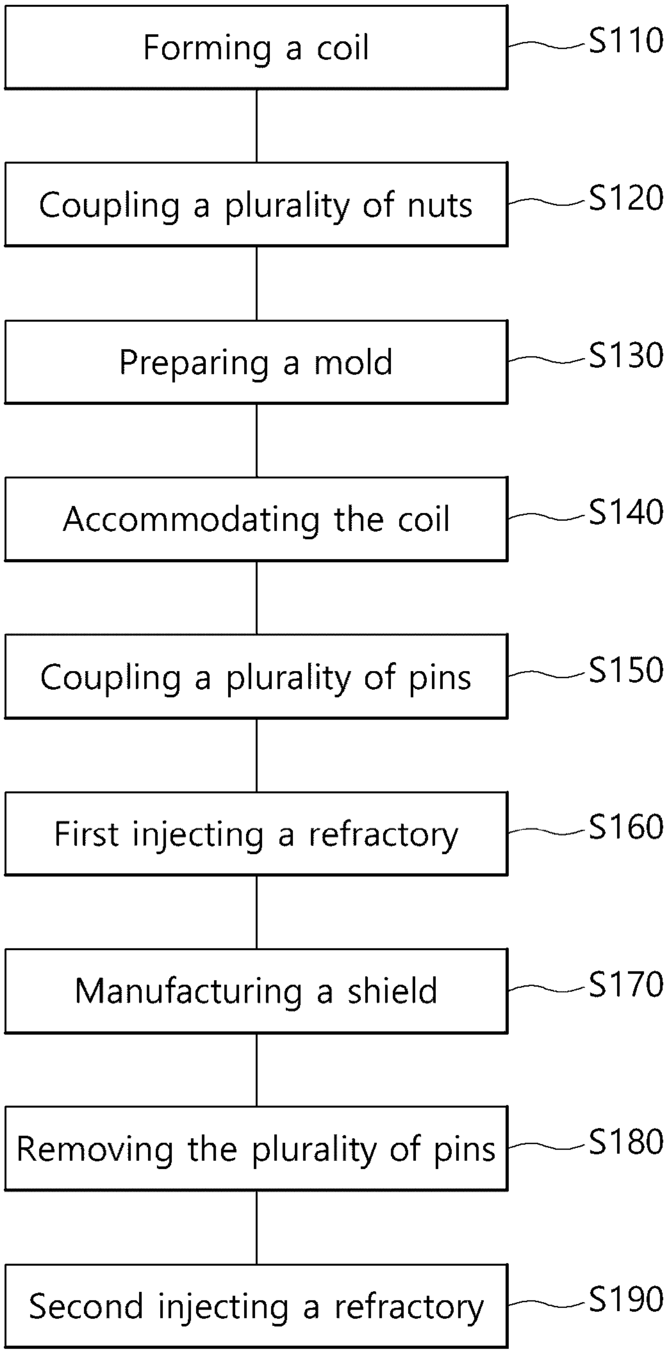
FIG. 10 is a flowchart showing a method for manufacturing a heater for an ingot growing apparatus according to another embodiment of the present invention.

FIG. 5 is a perspective view showing forming a coil in a method for manufacturing a heater for an ingot growing apparatus according to another embodiment of the present invention, FIG. 6 is an exploded perspective view showing a mold in a method for manufacturing a heater for an ingot growing apparatus according to another embodiment of the present invention, FIG. 7 is a view showing coupling a plurality of pins in a method for manufacturing a heater for an ingot growing apparatus according to another embodiment of the present invention, FIG. 8 is a view showing a state in which a plurality of pins are removed in a method for manufacturing a heater for an ingot growing apparatus according to another embodiment of the present invention, FIG. 9 is a perspective view showing a shield manufactured by a method for manufacturing a heater for an ingot growing apparatus according to another embodiment of the present invention, and FIG. 10 is a flowchart showing a method for manufacturing a heater for an ingot growing apparatus according to another embodiment of the present invention.

Referring to FIGS. 5 to 10, the method for manufacturing a heater for an ingot growing apparatus according to another embodiment of the present invention may include forming a coil (S110), coupling a plurality of nuts (S120), preparing a mold (S130), accommodating a coil (S140), coupling a plurality of pins (S150), first injecting a refractory (S160), manufacturing a shield (S170), removing a plurality of pins (S180), and second injecting a refractory (S190). In this case, the coil 210' of the heater 200' for an ingot growth apparatus according to another embodiment of the present invention may be spirally wound more times than the coil 210 of the heater 200 of the ingot growing apparatus according to an embodiment of the present invention. Accordingly, the size of the heater 200' for an ingot growing apparatus according to another embodiment of the present invention may be larger than the size of the heater 200 of the ingot growing apparatus according to an embodiment of the present invention. That is, the heater 200' for an ingot growth apparatus according to another embodiment of the present invention has only a difference in the number of windings of the coil and the size of the heater, a method for manufacturing a heater for an ingot growing apparatus according to another embodiment of the present invention may be applied to a method for manufacturing a heater for an ingot growth apparatus according to an embodiment of the present invention. In addition, if the components of the heater for an ingot growing apparatus according to another embodiment of the present invention are the same as or similar to the components according to an embodiment of the present invention, the above description will be replaced.

In the step of forming a coil at S110, as shown in FIG. 5, the coil 210' is seated while being wound around a coil support member 310. The coil support member 310 may have a shape corresponding to an outer surface 121 of the susceptor 120. For example, when the susceptor has a reverse dome shape, the coil support member 310 may also have a reverse dome shape.

The coil support member 310 may support the coil 210' so that the coil 210' is formed in a spiral shape.

In the step of coupling a plurality of nuts at S120, the plurality of nuts 230' may be coupled to the outer surface of the coil 210 by welding.

In the step of preparing a mold at S130, a mold having an inner space accommodating the coil 210' may be provided. As shown in FIG. 6, the mold may include a first mold 320 and a second mold 330.

The first mold 320 may have a shape surrounding the spiral coil 210'. The second mold 330 may have a shape corresponding to that of the first mold 320. And, the size of the second mold 330 may be larger than the size of the first mold 320. In addition, the first mold 320 may be accommodated inside the second mold 330.

In the step of accommodating a coil at S140, the mold may accommodate the coil 210'. The coil 210' may be accommodated in the second mold 330, and the first mold 320 may partially cover the coil 210'. That is, the coil 210' may be accommodated between the first mold 320 and the second mold 330.

In the step of coupling a plurality of pins at S150, the second mold 330 and the plurality of nuts 230' may be coupled with a plurality of pins 333.

The plurality of pins 333 may be formed in a bolt shape. The plurality of pins 333 may be coupled to the plurality of nuts 230' in a bolt fastening method.

In addition, the first mold 320 and the second mold 330 may be coupled by a fastening member 331. Accordingly, the first mold 320 and the second mold 330 may be maintained in a state where the coil 210' is accommodated by being coupled by the fastening member 331.

In the step of first injecting a refractory at S160, a refractory is injected into the mold.

The refractory may be made by mixing 92% to 94% by weight of ceramic powder and 6% to 8% by weight of water. The ceramic powder and the water may be mixed by a mixer. In addition, the ceramic powder may include at least one of aluminum oxide ($Al_2O_3$), silicon dioxide ($SiO_2$), and zirconium dioxide ($ZrO_2$).

In addition, the step of first injecting a refractory at S160 may include a step of applying vibration to the mold by a vibration device. In the vibrating step, the density of the refractory in the molds 320 and 330 accommodating the coil 210' may be increased.

In the step of manufacturing a shield at S170, the shield 220' surrounding the coil 210' may be manufactured by solidifying the refractory.

The step of manufacturing a shield at S170 may include a step of first drying a refractory at room temperature for 24 hours to 48 hours. As the refractory is dried at room temperature, the efficiency of energy consumed for drying may be improved.

Further, according to various embodiments of the present invention, the step of manufacturing a shield at S170 may include a step of second drying a refractory at approximately 100° C. to 350° C. for 48 hours to 72 hours. In addition, the refractory may be sintered at approximately 350° C. As the refractory is dried at approximately 100° C. to 350° C., the density of the refractory may be increased.

In the step of removing a plurality of pins at S180, the plurality of pins 333 fastened through the fastening holes **330*a* of the second mold 330 may be removed. A screw hole having a shape corresponding to the plurality of pins 333 may be formed in the shield 220' by the plurality of pins 333. In this case, the plurality of pins 333 may be separated from the shield 220'** through the screw holes by rotating in a screw manner.

In the step of injecting a second refractory at S190, a refractory may be injected into a screw hole created by removing the pin. The refractory may be made of the same material as the refractory in the step of injecting a first refractory at S190.

In addition, when the refractory is solidified after the step of injecting a second refractory at S190, the heater 200' shown in FIG. 9 may be manufactured.

A first terminal 211' connected to one side of the coil 210' and a second terminal 212' connected to the other side of the coil 210' may be formed on the outer surface of the heater 200'. The first terminal 211' and the second terminal 212' may be electrically connected to power supplied from the outside.

Although exemplary embodiments of the present invention have been described, the idea of the present invention is not limited to the embodiments set forth herein. Those of ordinary skill in the art who understand the idea of the present invention may easily propose other embodiments through supplement, change, removal, addition, etc. of elements within the same idea, but the embodiments will be also within the scope of the present invention.

What is claimed is:

1. An ingot growing apparatus, comprising:
- a crucible for accommodating molten silicon;
- a growth furnace having an inner space in which the crucible is installed;
- a susceptor having an inner surface shaped to correspond to an outer surface of the crucible and surrounding the outer surface of the crucible; and
- a heater for heating the susceptor, wherein the heater comprises:
- a coil which is fixed at a position spaced a predetermined distance apart from an outer surface of the susceptor, is formed to be wound along the outer surface of the susceptor to generate a magnetic field, and heats the susceptor by electromagnetic induction due to the magnetic field;
- a shield which is formed to surround an outer surface of the coil to support the coil and blocks the coil from being exposed to the inner space of the growth furnace; and
- a nut disposed inside the shield and coupled to an outer surface of the coil so as to face an outer surface of the shield opposite to the susceptor.

2. The ingot growing apparatus of claim 1,
wherein the coil is formed to be wound multiple times along the outer surface of the susceptor.

3. The ingot growing apparatus of claim 2, wherein a material of the nut is the same as a material of the coil.

4. The ingot growing apparatus of claim 2,
wherein the shield comprises:
- a shield body having a shape corresponding to the outer surface of the susceptor; and
- a nut blocking part disposed inside the shield body to block the nut from being exposed to outside of the shield body.

5. The ingot growing apparatus of claim 4, wherein an inner surface of the nut blocking part is formed with threads corresponding to an outer surface shape of a bolt.

6. The ingot growing apparatus of claim 1, wherein the shield is made of a non-metallic material.

7. The ingot growing apparatus of claim 1, wherein the shield comprises a ceramic material.

8. The ingot growing apparatus of claim 7, wherein the ceramic comprises at least one of aluminum oxide ($Al_2O_3$), silicon dioxide ($SiO_2$), and zirconium dioxide ($ZrO_2$).

9. The ingot growing apparatus of claim 1, wherein the shield is disposed spaced apart from the susceptor.

* * * * *